(12) United States Patent
Ueda et al.

(10) Patent No.: US 8,111,367 B2
(45) Date of Patent: Feb. 7, 2012

(54) DISPLAY DEVICE

(75) Inventors: Hiroshi Ueda, Kumamoto (JP);
Shigeaki Noumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 466 days.

(21) Appl. No.: 12/250,725

(22) Filed: Oct. 14, 2008

(65) Prior Publication Data

US 2009/0096973 A1    Apr. 16, 2009

(30) Foreign Application Priority Data

Oct. 15, 2007   (JP) .................................. 2007-267801

(51) Int. Cl.
*G02F 1/1345* (2006.01)
(52) U.S. Cl. ........................................ 349/149; 349/138
(58) Field of Classification Search .......... 349/149–151, 349/138
See application file for complete search history.

(56) References Cited

U.S. PATENT DOCUMENTS

2003/0164919 A1    9/2003   Oh et al.
2008/0180627 A1 *  7/2008   Yasuda et al. ................ 349/152

FOREIGN PATENT DOCUMENTS

| JP | 2000-171817 | 6/2000 |
| JP | 2001-358174 | 12/2001 |
| JP | 2003-131253 | 5/2003 |

* cited by examiner

*Primary Examiner* — Eric Wong
(74) *Attorney, Agent, or Firm* — Oblon, Spivak, McClelland, Maier & Neustadt, L.L.P.

(57) ABSTRACT

A display device comprises a metallic wiring formed on an insulating substrate, an inorganic insulating film formed on the metallic wiring, an organic resin film formed on the inorganic insulating film, a transparent conductive film formed in a portion on the metallic wiring where the inorganic insulating film and the organic resin film are removed, a connection terminal formed in a region for mounting a driving IC external to the display region on the insulating substrate, and a bump of the driving IC connected to the connection terminal by an anisotropic conductive film in order to supply a signal to the display region. The region for mounting a driving IC includes a region where the inorganic insulating film and the organic resin film are formed on the metallic wiring and a region where the inorganic insulating film and the organic resin film are removed from the metallic wiring.

2 Claims, 2 Drawing Sheets

DISPLAY DEVICE

This application claims priority from Japanese Patent Application No. 2007-267801 filed on Oct. 15, 2007, the entire subject matter of which is incorporated herein by reference.

BACKGROUND OF THE INVENTION

1. Field of the Invention

The present invention relates to a display device including an organic resin film and in particular to a connection structure for mounting a driving circuit (driving IC) on the periphery of a display region.

2. Description of the Related Art

For example, a display device using liquid crystal includes two insulating (for example glass) substrates with liquid crystal sandwiched therebetween and a driving IC connected to the end of the insulating substrates, the insulating substrates arranged on a planar light source device called a backlight. For example, in a liquid crystal display device using a thin-film transistor (TFT), thin-film transistors are arranged in a matrix shape on one substrate (TFT array substrate) out of the two insulating substrates and the substrate is overlaid on the other substrate (CF substrate) with the external shape protruding beyond the same. Further, in the case of a reflective or semi-transparent type liquid crystal display device, a reflection electrode layer composed of an organic resin film is formed to form a reflection electrode including asperities on a TFT array substrate. Each TFT includes a pixel formed thereon. An image signal transmitted to a pixel is controlled by turning ON or OFF the TFT. Source wiring for inputting an image signal from the source electrode of each TFT is drawn to the end of a glass substrate. Near the end of the TFT array substrate is formed a pad (connection terminal) for connecting a driving IC. The inorganic insulating film layer is removed from the surface of the pad and a transparent conductive film is formed on the exposed source wiring material.

Gate wiring for turning ON/OFF the TFT is drawn from the gate electrode of each TFT to the end of the TFT substrate. Near the end of the TFT array substrate is formed a pad (connection terminal) for connecting a driving IC, same as the source side. For example, in a configuration where a driving IC is mounted by a flip-chip mounting method, a driving IC is directly mounted on the connection terminal in a mounting region arranged in a portion where the TFT array substrate at the panel end is protruding by way of an adhesive resin including conductive particles dispersed therein called ACF (anisotropic conductive film). At the end of the wiring arranged near the driving IC on the TFT array substrate closer to the end the TFT array substrate is formed a pad. To the pad is connected an FPC (flexible printed circuit board) via an ACF. The FPC is connected to a circuit board for controlling a driving IC. A control signal and a power for the driving IC are inputted to the driving IC via the wiring on the FPC and the wiring on the TFT array substrate. There may be a case where a driving IC is directly connected to a terminal formed on a TFT array substrate instead of an FPC.

In the related art, an example of a driving IC connecting structure of a liquid crystal display device using an organic resin film such as a reflective type liquid crystal display device does not form an organic resin film in the connecting portion of a driving IC and covers its surface with an inorganic insulating film layer alone (for example, refer to JP-A-2000-171817 (FIG. 2)).

With the driving IC connecting structure in the related art, it is necessary to provide a larger region where an organic resin film is removed than a region where an inorganic insulating film is removed in order to form a connection terminal on an insulating substrate. Thus, it is necessary to separately provide a process for removing an organic resin film and a process for removing an inorganic insulating film. This adds to the number of manufacturing processes and manufacturing costs. Another approach is to remove an organic resin film and an inorganic insulating film broadly over the periphery of a driving IC by using the same mask. In case this method is used, all the metallic wiring is exposed in a portion where the organic resin film and the inorganic insulating film are removed, resulting in reduced insulating properties between wires or corrosion of wiring. Another approach is to remove only the connection terminals of an organic resin film and an inorganic insulating film at the same time by using the same pattern. This method presents a problem that the bonding strength between the anisotropic conductive film for connection and the organic resin film is lower than that between the anisotropic conductive film and the inorganic insulating film thus reducing the connection reliability.

SUMMARY OF THE INVENTION

The invention has been accomplished in view of the above problems. An object of the invention is to provide a display device free from an increase in the production costs related to pattern formation of an organic resin film and an inorganic insulating film, reduced insulating properties and corrosion caused by exposure of a wiring pattern, or reduction in the connection reliability of a driving IC unlike in the related art.

The invention provides a display device comprising: an insulating substrate on which a display region is formed; metallic wiring formed on the insulating substrate; an inorganic insulating film formed on the metallic wiring; an organic resin film formed on the inorganic insulating film; a transparent conductive film formed in a portion on the metallic wiring where the inorganic insulating film and organic resin film are removed; a connection terminal formed in a driving IC mounting region external to the display region on the insulating substrate; and the bump of the driving IC connected to the connection terminal by an anisotropic conductive film in order to supply a signal to the display region; characterized in that the driving IC mounting region includes a region where the inorganic insulating film and the organic resin film are formed on the metallic wiring and a region where the inorganic insulating film and the organic resin film are removed from the metallic wiring.

With the invention, it is possible to obtain a display device free from an increase in the production costs related to pattern formation of an organic resin film and an inorganic insulating film or reduced insulating properties and corrosion caused by exposure of a wiring pattern, and featuring improved connection reliability of a driving IC.

DETAILED DESCRIPTION OF THE PREFERRED EMBODIMENTS

Embodiment 1

Figure 1:
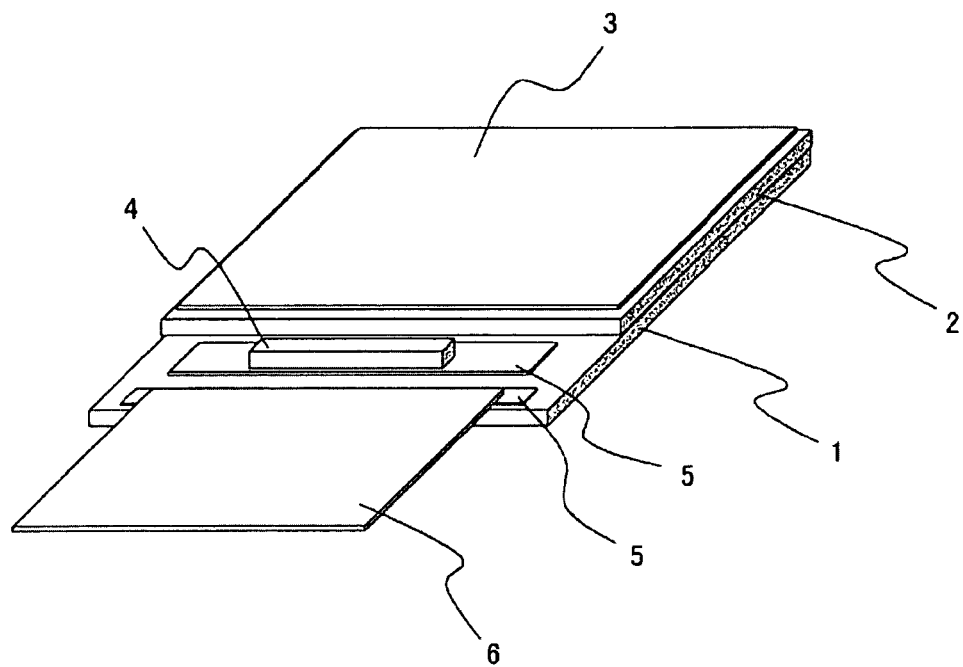
FIG. 1 is a general external view of a display device according to Embodiment 1 of the invention.
Figure 2:
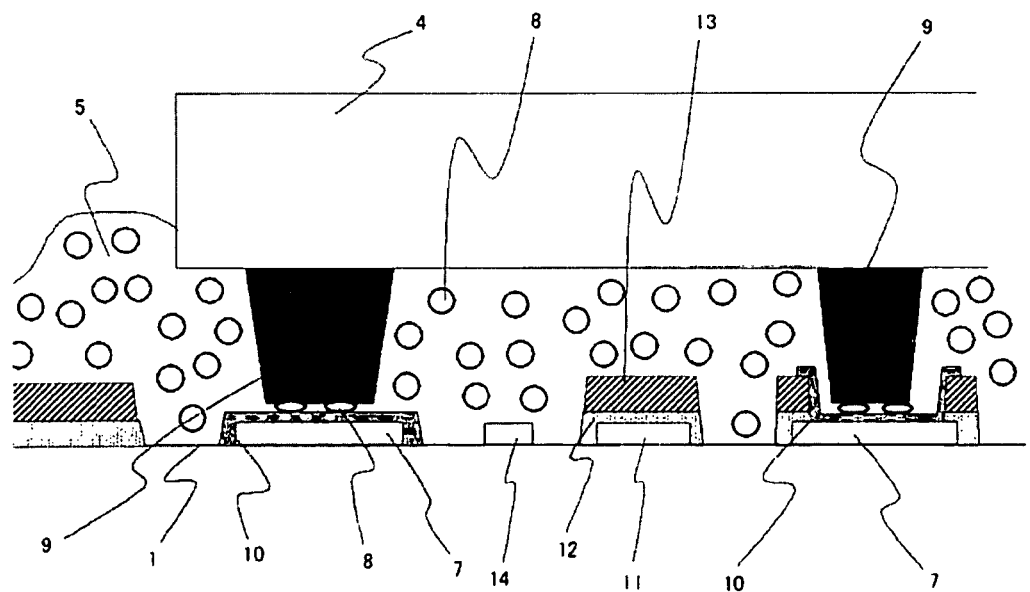
FIG. 2 is a cross-sectional view of a driving IC mounting part of a display device according to Embodiment 1 of the invention.

Embodiment 1 of the invention will be described referring to FIGS. 1 and 2. FIG. 1 is a general external view of a display device according to Embodiment 1 of the invention. FIG. 2 is a cross-sectional view of a driving IC mounting part of a display device according to Embodiment 1 of the invention.

Referring to FIG. 1, an insulating substrate (TFT array substrate) 1 and a counter substrate (CF substrate) 2 both formed by glass or the like are overlaid one on the other, and a polarizer 3 is bonded to the external surface thereof. The insulating substrate 1 includes a part protruding further outward than the counter substrate 2. On the protruding part is formed a region for mounting a circuit member such as a driving IC 4. In the region for mounting a driving IC 4, an anisotropic conductive film (for example ACF: an isotropic conductive film) 5 is bonded on a connection terminal formed on the insulating substrate 1. On the anisotropic conductive film is mounted a driving IC 4 for driving liquid crystal. In an outward region closer to the substrate end than the driving IC 4 mounted on the insulating substrate 1 is bonded an anisotropic conductive film 5, same as the driving IC 4, and a flexible circuit board 6 is mounted on the anisotropic conductive film 5.

FIG. 2 is a cross-sectional view of a part for mounting a driving IC 4 on the insulating substrate 1 of a display device 100 according to the invention shown in FIG. 1. A connection terminal 7 composed of a metal is formed in a region on the insulating substrate 1 where the driving IC 4 is mounted. A transparent conductive film 10 is formed in a region where the inorganic insulating film 12 and the organic resin film 13 are removed from the connection terminal 7. The bump 9 of the driving IC 4 is connected onto the transparent conductive film 10 via conductive particles 8 of an anisotropic conductive film 5. The conductive particles 8 are dispersed in the anisotropic conductive film 5 and are generally composed of spherical plastics 3 to 5 μm in diameter with Ni plating or Au plating applied thereon. The anisotropic conductive film 5 is a thermosetting resin including conductive particles 8 distributed therein and formed into a film. The bump 9 of the driving IC 4 and the insulating substrate 1 sandwich, heat and pressurize the anisotropic conductive film 5 to harden the thermosetting resin in the anisotropic conductive film 5 to cause the anisotropic conductive film 5 to be mechanically held on the insulating substrate 1 and electrically connected to the transparent conductive film 10 on the connection terminal 7. On metallic wiring 11 that is likely to affect the quality are formed an inorganic insulating film 12 and an organic resin film 13. An inorganic insulating film 12 and an organic resin film 13 are formed in a region external to the region for mounting a driving IC 4.

The portion of the mounting region except the metallic wiring 11 includes a portion where the inorganic insulating film 12 and the organic resin film 13 are removed. The surface of the insulating substrate 1 or metallic wiring 14 that is unlikely to affect the quality and the anisotropic conductive film 5 are in direct contact with each other. The metallic wiring 11 that is likely to affect the quality refers to, for example, wiring with a high potential, wiring with a large potential difference from adjacent wiring, wiring with a potential difference from adjacent wiring and close to the same, wiring vulnerable to corrosion, or relatively thin wiring compared with other wiring. The metallic wiring that is unlikely to affect the quality refers to, for example, an alignment mark, wiring to which a potential is not applied or wiring made of a material that is less vulnerable to corrosion. The term "metallic wiring" used herein includes wiring to which any potential is supplied as well as an alignment mark or a floating pattern composed of a metallic film. The inorganic insulating film 12 and the organic resin film 13 are removed from the metallic wiring 14 that is unlikely to affect the quality in the region for mounting a driving IC 4. To enhance the connection reliability of a driving IC 4, it is thus preferable to remove, if possible, the inorganic insulating film 12 and the organic resin film 13 from the metallic wiring 14 that is unlikely to affect the quality. This reduces the portion where the anisotropic conductive film 5 is in direct contact with the organic resin film 13 in the mounting region thus reliably connecting the driving IC 4 and the TFT array substrate 1 with each other.

On the edge part of the connection terminal 7 shown in FIG. 2, the inorganic insulating film 12 and the organic resin film 13 may be removed across the entire electrode like the connection terminal 7 on the left-hand side of FIG. 2, or the inorganic insulating film 12 and the organic resin film 13 may remain on the periphery of the connection terminal 7 as shown by the connection terminal 7 on the right-hand side of FIG. 2.

Next, processes for manufacturing a display device 100 shown in FIGS. 1 and 2 will be described. A first metallic film serving as a scan line or a storage capacity line is formed on the insulating substrate 1. The first metallic film is formed by a thin film made of a material such as Al, Cr, Cu, Ta, or Mo, or an alloy of one of these and another substance. Next, a photolithography process is used to pattern the first metallic film to form the metallic wiring 11 or the metallic wiring 14 serving as a scan line or a storage capacity line and the connection terminal 7.

After that, a film forming device such as a plasma CVD device is used to successively form a gate insulating film, a semiconductor film, and an ohmic contact film. The gate insulating film may be SiNx, SiOx, or SiOxNy as an inorganic insulating film or a laminate film of these. The semiconductor film may be made of amolphous silicon (a-Si) or polysilicon (p-Si). The ohmic contact film uses n-a-Si or n-p-Si formed by an a-Si film or a p-Si film into which a small amount of phosphor (P) or the like is doped. The photolithography process is used to pattern the semiconductor film and the ohmic contact film by way of dry etching or the like.

Next, a second metallic film serving as a picture signal line is formed. The second metallic film is formed by a thin film made of a material such as Al, Cr, Cu, Ta, or Mo, or an alloy of one of these and another substance, a laminate of heterogeneous metallic films, or a thin film of different compositions in the film thickness direction. Next, a photolithography process is used to form the metallic wiring 11 or 14 serving as a picture signal line. In the process of patterning the picture signal line, a source electrode and a drain electrode are formed at the same time. The connection terminal 7 may be formed by the second metallic film.

Figure 4:
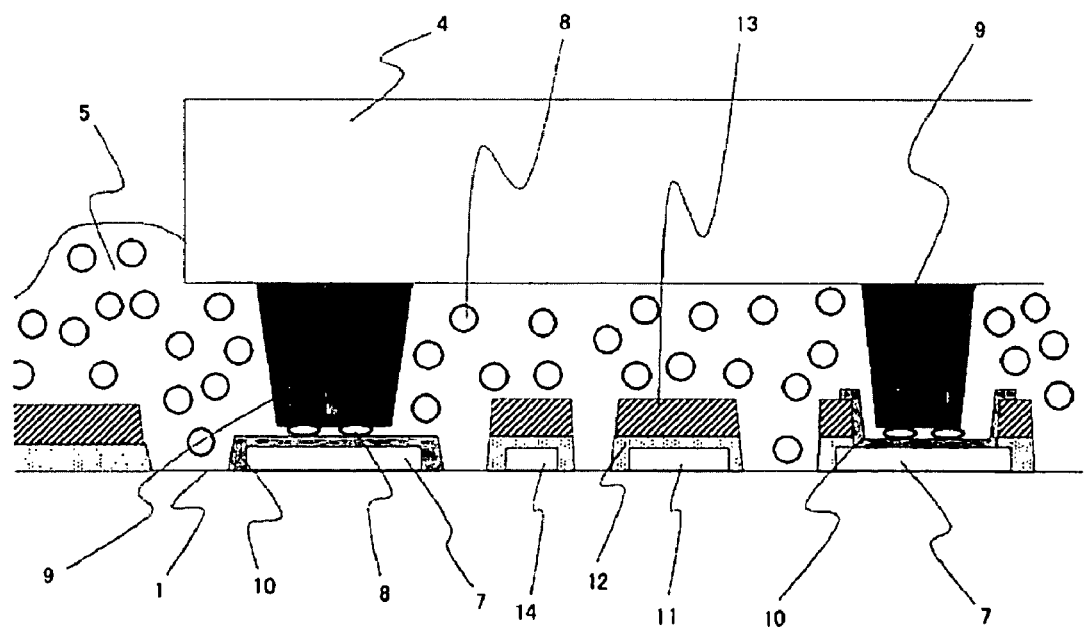
FIG. 4 is a cross-sectional view of a driving IC mounting part of a display device according to Embodiment 3 of the invention.

An inter-layer insulating film is formed on a film forming device such as a plasma CVD device. Same as the gate insulating film, the inter-layer insulating film may use SiNx, SiOX, or SiOxNy, or a laminate film of these. Next, an organic resin film is formed and the organic resin film, gate insulating film and inter-layer insulating film are patterned with the same mask in a photolithography process. After that, a contact hole is formed by the collective patterning of the organic resin film, inter-layer insulating film and gate insulating film. The drain electrode is electrically continued to a pixel electrode (described later) via the contact hole. It is thus made possible to remove the gate insulating film, inter-layer insulating film and organic resin film on the metallic wiring 14 that is unlikely to affect the quality and the connection terminal 7. In this case, at least the inorganic insulating film 12 is preferably patterned so as to reliably cover the entirety of the upper surface and side surfaces of the metallic wiring 11 as shown in FIG. 4. Further, the inorganic insulating film 12 formed on the side surface of the metallic wiring 11 preferably has a thickness of at least 3 μm in the direction level with respect to the insulating substrate 1. With this configuration, it is possible to reliably prevent corrosion of the metallic wiring 11. After that, a reflection electrode is formed and patterned in a display device including a reflective liquid crystal display.

A conductive thin film as a transparent metal such as ITO or $SnO_2$ serving as a pixel electrode is formed on the inter-layer insulating film. In a photolithography process, the conductive thin film is patterned so as to be surrounded by a scan line, a storage capacity line and a picture signal line to complete an insulating substrate on which a TFT or the like is formed.

In FIGS. 1 and 2, the inorganic insulating film 12 is composed of the gate insulating film and the inter-layer insulating film. The metallic wiring 11, 14 and the connection terminal 7 are formed by either the first metallic film or the second metallic film or both of them. The inorganic insulating film 12 and the organic resin film 13 formed by a gate insulating film and an inter-layer insulating film may be patterned with the same mask. The inorganic insulating film may be formed by a single layer of either a gate insulating film or an inter-layer insulating film instead of both. For the metallic wiring composed of the first metallic wiring or the second metallic wiring, it is determined whether to remove an inorganic insulating film and an organic resin film depending on whether the metallic wiring is likely to affect the quality as described above.

While a transparent conductive film 10 is formed on the connection terminal 7 and the transparent conductive film 10 is connected to the bump 9 of the driving IC 4 via the anisotropic conductive film 5 in FIGS. 1 and 2, the connection terminal 7 may be directly connected to the bump 9 of the driving IC 4 via the anisotropic conductive film 5.

With this configuration, it is possible to pattern an organic resin film and an inorganic insulating film with the same mask without increasing the production costs, suppress reduction in the insulating properties and corrosion caused by exposure of metallic wiring, and reduce the area of the portion where an anisotropic conductive film and an organic resin film are in direct contact with each other in a mounting region. It is thus possible to obtain a display device free from reduction in the connection reliability of a driving IC.

Embodiment 2

Figure 3:
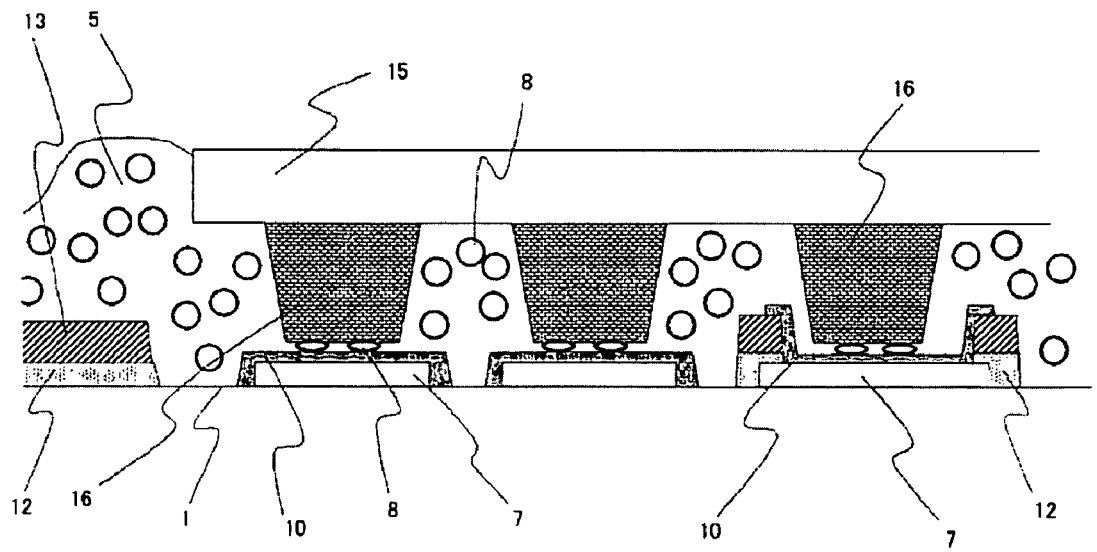
FIG. 3 is a cross-sectional view of a driving IC mounting part of a display device according to Embodiment 2 of the invention.

Embodiment 2 of the invention will be described referring to FIG. 3. FIG. 3 is a cross-sectional view of a driving IC mounting part of a display device according to Embodiment 2 of the invention. In FIG. 3, a component same as that in FIGS. 1 and 2 is given the same sign and differences from Embodiment 1 will be described.

In FIG. 3, a flexible circuit board 15 composed of a polyimide film and copper foil wiring is mounted in place of a driving IC in Embodiment 1. In FIG. 3, the lead terminal 16 of the flexible circuit board 15 is connected to the transparent conductive film 10 on the connection terminal 7 via the anisotropic conductive film 5. In a region of the flexible circuit board 15 external to the mounting region are formed an inorganic insulating film 12 and an organic resin film 13. As shown by the connection terminals 7 on the left-side and in the center of FIG. 3, the inorganic insulating film 12 and the organic resin film 13 may be removed across the entire electrode on the edge part of the connection terminal 7. Or, as shown by the connection terminal 7 on the rightmost side of FIG. 3, the inorganic insulating film 12 and the organic resin film 13 may remain on the periphery of the electrode. For the metallic wiring 11, 14 also, in case the metallic wiring is formed in the region for mounting a flexible circuit board 15 in this embodiment, the same configuration as Embodiment 1 may be employed to provide the same working effect as Embodiment 1.

With the above configuration, also in case a flexible circuit board is mounted on an insulating substrate, it is possible to pattern an organic resin film and an inorganic insulating film with the same mask without increasing the production costs, suppress reduction in the insulating properties and corrosion caused by exposure of metallic wiring, and reduce the area of the portion where an anisotropic conductive film and an organic resin film are in direct contact with each other in a mounting region, thereby obtaining a display device free from reduction in the connection reliability of a flexible circuit board.

Embodiment 3

Embodiment 3 of the invention will be described referring to FIG. 4. FIG. 4 is a cross-sectional view of a driving IC mounting part of a display device according to Embodiment 3 of the invention. In FIG. 4, a component same as that in FIGS. 1 to 3 is given the same sign and differences from Embodiments 1 or 2 will be described.

In Embodiments 1 and 2, also for the metallic wiring 14 that is unlikely to affect the quality, it is assumed that a reflection electrode is formed by an alloy of the same system as the metallic wiring 14 (for example an Al alloy or a metal group etched with the etching liquid of the same system) and patterned after the metallic wiring 14 is patterned. In case an inorganic insulating film and an organic resin film on the metallic wiring 14 have been removed, the metallic wiring 14 is etched at the same time. In case only a metal vulnerable to corrosion is used as a material of the metallic wiring, the metallic wiring may be more likely to be corroded in the absence of an inorganic insulating film and an organic resin film on the metallic wiring. As a countermeasure, as shown in FIG. 4, a configuration may be employed where an inorganic insulating film 12 and an organic resin film 13 remain on the metallic wiring 11 and 14 alone in the region where the driving IC 4 is mounted and the inorganic insulating film 12 and the organic resin film 13 are removed substantially across the entirety of the remaining region. The inorganic insulating film 12 and the organic resin film 13 may remain on the edge part on the connection terminal 7 (shown by the connection terminal on the right-hand side of FIG. 3).

With this configuration, metallic wiring is not etched when a reflection electrode is formed by an alloy of the same system as the metallic wiring following the process of patterning the metallic wiring. The metallic wiring is free from corrosion even in case only a metal vulnerable to corrosion is used as a material of the metallic wiring. In the region for mounting a driving IC except the metallic wiring portion, an inorganic insulating film and an organic resin film are removed substantially over the entire portion, so that the region where an anisotropic conductive film and an organic resin film are in direct contact with each other can be reduced. It is thus possible to obtain a display device free from reduction in the connection reliability of a driving IC.

Same as Embodiment 1, the inorganic insulating film 12 is preferably patterned so as to reliably cover the entirety of the upper surface and side surfaces of the metallic wiring 11, 14 as shown in FIG. 4. Further, the inorganic insulating film 12 formed on the side surface of the metallic wiring 11, 14 preferably has a thickness of at least 3 μm in the direction level with respect to the insulating substrate 1. With this configuration, it is possible to reliably prevent corrosion of the metallic wiring 11, 14. While a driving IC is mounted in this embodiment, a flexible circuit board may be mounted in place of a driving IC, same as Embodiment 2.

While a display device using liquid crystal has been described in the foregoing embodiments, the invention is not limited thereto but is applicable to any display device using an electroluminescence element or the like as well as to any device where a driving circuit or a flexible circuit board is connected via an anisotropic conductive film to a device where an inorganic insulating film and an organic resin film are formed on an insulating substrate.

What is claimed is:

1. A display device comprising:
    an insulating substrate on which a display region is formed;
    metallic wiring formed on the insulating substrate;
    an inorganic insulating film formed on the metallic wiring;
    an organic resin film formed on the inorganic insulating film;
    a transparent conductive film formed in a portion on the metallic wiring where the inorganic insulating film and organic resin film are removed;
    a connection terminal formed in a driving IC mounting region external to the display region on the insulating substrate; and
    a bump of the driving IC connected to the connection terminal by an anisotropic conductive film in order to supply a signal to the display region,
    wherein the inorganic insulating film and the organic resin film in a region are removed from at least a portion of the metallic wiring in the driving IC mounting region.

2. The display device according to claim 1, wherein the inorganic insulating film and the organic resin film in a region except the metallic wiring and the edge part of the connection terminal are removed in the driving IC mounting region.

* * * * *